(12) United States Patent
Hu

(10) Patent No.: US 9,070,647 B2
(45) Date of Patent: Jun. 30, 2015

(54) DUAL EMITTING METHOD AND DEVICE FOR ACTIVE MATRIX ORGANIC ELECTROLUMINESCENCE

(75) Inventor: Shuo-Hsiu Hu, Hsinchu (TW)

(73) Assignee: AU OPTRONICS CORPORATION, Hsinchu (TW)

( * ) Notice: Subject to any disclaimer, the term of this patent is extended or adjusted under 35 U.S.C. 154(b) by 328 days.

(21) Appl. No.: 10/911,483

(22) Filed: Aug. 5, 2004

(65) Prior Publication Data

US 2006/0027819 A1    Feb. 9, 2006

(51) Int. Cl.
*H01L 21/00* (2006.01)
*H01J 63/04* (2006.01)
*H01L 27/32* (2006.01)
*G09G 3/32* (2006.01)

(52) U.S. Cl.
CPC .......... *H01L 27/3267* (2013.01); *G09G 3/3208* (2013.01); *G09G 2300/0452* (2013.01)

(58) Field of Classification Search
CPC ................... H01L 2251/5315; H01L 27/3244; H01L 51/5262; H01L 51/5281; H01L 27/3267; H01L 2251/5323; H01L 2251/5307
USPC .............. 257/59, 72, 83; 438/29, 34; 313/505
See application file for complete search history.

(56) References Cited

U.S. PATENT DOCUMENTS

| 2004/0075628 | A1 | 4/2004 | Chien et al. ...................... 345/82 |
| 2005/0116620 | A1* | 6/2005 | Kobayashi .................... 313/503 |
| 2008/0252204 | A1* | 10/2008 | Yoshida et al. ............... 313/504 |

* cited by examiner

*Primary Examiner* — Minh-Loan Tran
(74) *Attorney, Agent, or Firm* — McClure, Qualey & Rodack, LLP

(57) ABSTRACT

An organic electroluminescence (EL) device is provided, including a transparent substrate and an array of pixels over the transparent substrate. Each of the pixels includes at least one first sub-pixel and at least one second sub-pixel, wherein the at least one first sub-pixel each includes a first organic light emitting diode for providing light in a first direction, and the second sub-pixel each includes a second organic light emitting diode for providing light in a second direction substantially opposite to the first direction.

5 Claims, 6 Drawing Sheets

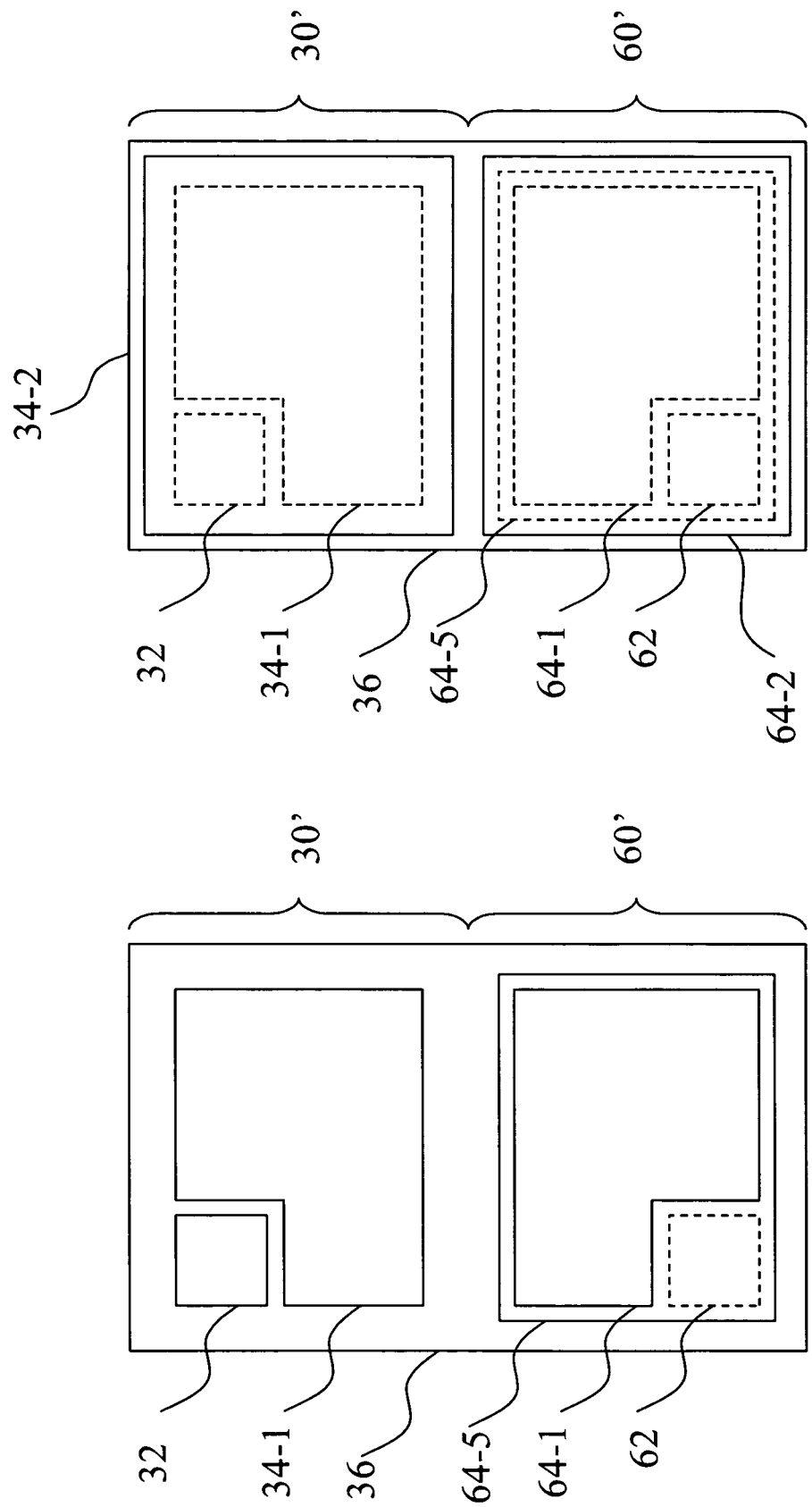

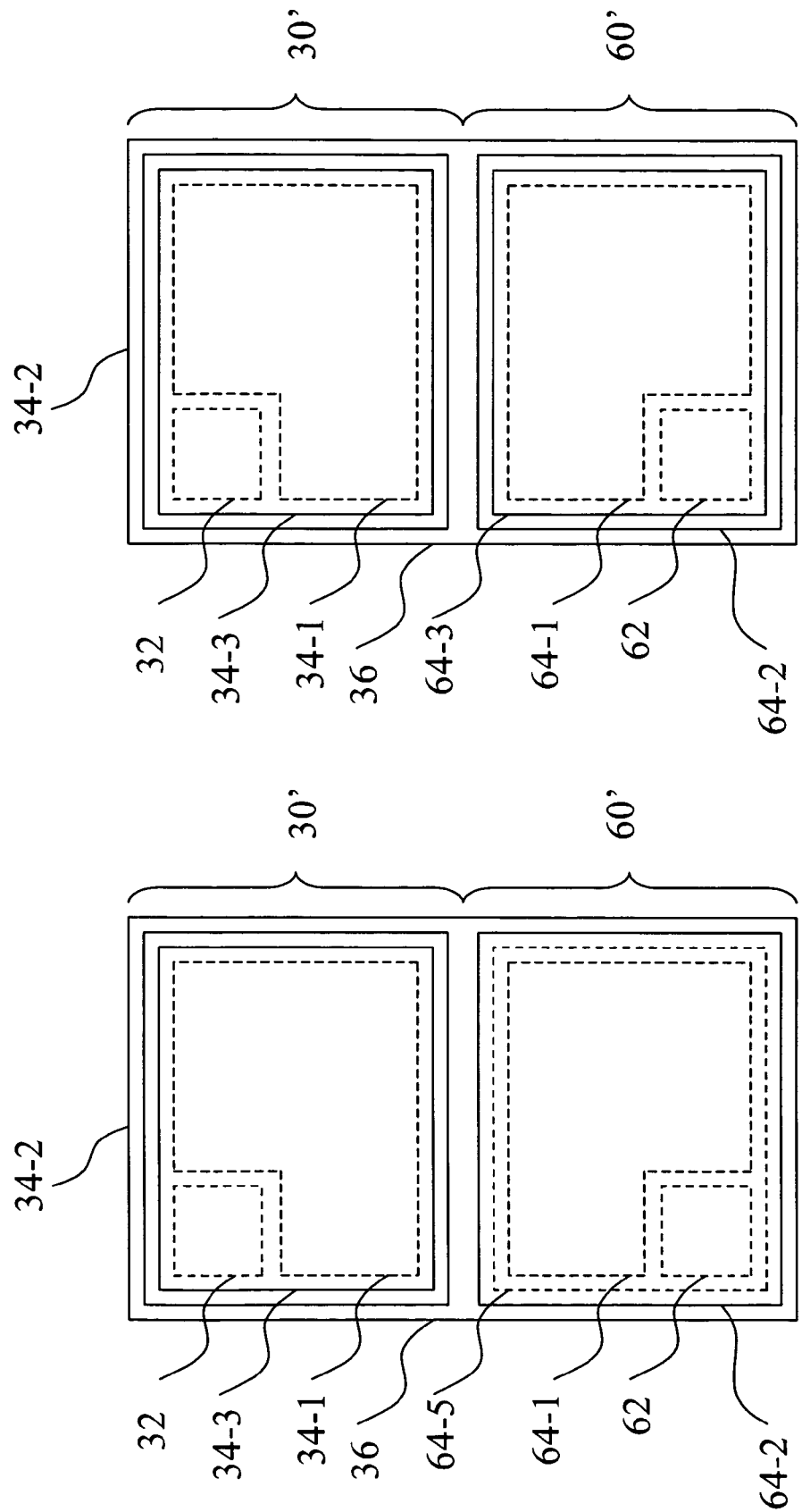

DUAL EMITTING METHOD AND DEVICE FOR ACTIVE MATRIX ORGANIC ELECTROLUMINESCENCE

FIELD OF THE INVENTION

The invention relates in general to an electroluminescence device and, more particularly, to a structure of an organic electroluminescence device including a single display panel for dual-display and a method of manufacturing the same.

BACKGROUND OF THE INVENTION

Flat panel display ("FPD") devices may include liquid crystal display ("LCD") devices and electroluminescence ("EL") devices. An EL device is a device which makes use of the phenomenon of electroluminescence to emit light. An EL device generally includes thin film transistors ("TFT") and an organic light-emitting diode ("OLED") further including a light-emitting layer. When a current passes between a cathode and an anode of the OLED device, light is emitted through the light-emitting layer.

Conventional organic EL devices can be designed to include two panels for dual display or double display: a main panel and a sub-panel. Generally, the main panel serves to provide main display functions of an electronic product, and the sub-panel serves to provide subsidiary display functions such as a caller identity display or a clock display. The main panel and the sub-panel are generally independent of each other, and include individual substrates, resulting in a disadvantageous increase in device size.

SUMMARY OF THE INVENTION

Embodiments consistent with the present invention provide for an organic EL device on a single substrate that provides a dual display function, whereby a device size is reduced.

To achieve these and other advantages, and consistent with the purpose of the invention as embodied and broadly described, there is provided an organic electroluminescence (EL) device, including a transparent substrate and an array of pixels over the transparent substrate. Each of the pixels includes at least one first sub-pixel and at least one second sub-pixel, wherein the at least one first sub-pixel each includes a first organic light emitting diode for providing light in a first direction, and the second sub-pixel each includes a second organic light emitting diode for providing light in a second direction substantially opposite to the first direction.

Consistent with the present invention, there is also provided an organic electroluminescence (EL) device including a transparent substrate and an array of pixels over the transparent substrate, each pixel including at least one first sub-pixel and at least one second sub-pixel, each pixel being in a respective pixel area, wherein each pixel area further includes at least one first area each for a corresponding first sub-pixel and at least one second area each for a corresponding second sub-pixel. Each pixel includes a first conductive layer over the substrate in at least the at least one first area, a second conductive layer over the substrate in the at least one second area, an organic EL layer over both the first conductive layer and the second conductive layer in both the at least one first area and the at least one second area, a third conductive layer over the organic EL layer in the at least one first area, and a fourth conductive layer over the organic EL layer in at least the at least one second area, wherein the first conductive layer, the organic EL layer, and the third conductive layer in each of the at least one first area collectively form a corresponding first sub-pixel, and the second conductive layer, the organic EL layer, and the fourth conductive layer in each of the at least one second area collectively form a corresponding second sub-pixel, and wherein the first conductive layer and the fourth conductive layer are transparent.

Consistent with the present invention, there is still provided a method of manufacturing an organic electroluminescence (EL) device including providing a transparent substrate, defining a first area and a second area on the transparent substrate, forming a transistor in each of the first and second areas, forming a first light reflecting layer over the substrate in the second area, forming a first transparent conductive layer over the substrate in the first area and over the first light reflecting layer, forming an organic electroluminescence layer over the first transparent conductive layer in both the first area and the second area, forming a second light reflecting layer over the organic electroluminescence layer in the first area, and forming a second transparent conductive layer over the organic electroluminescence layer in at least the second area and over the second light reflecting layer.

Additional features and advantages of the invention will be set forth in part in the description which follows, and in part will be obvious from the description, or may be learned by practice of the invention. The features and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

BRIEF DESCRIPTION OF THE DRAWINGS

FIGS. 4A to 4F are diagrams showing a method of manufacturing an organic EL device consistent with an embodiment of the present invention.

DESCRIPTION OF THE EMBODIMENTS

Reference will now be made in detail to the exemplary embodiments of the invention, examples of which are illustrated in the accompanying drawings. Wherever possible, the same reference numbers will be used throughout the drawings to refer to the same or like parts.

Figure 1:
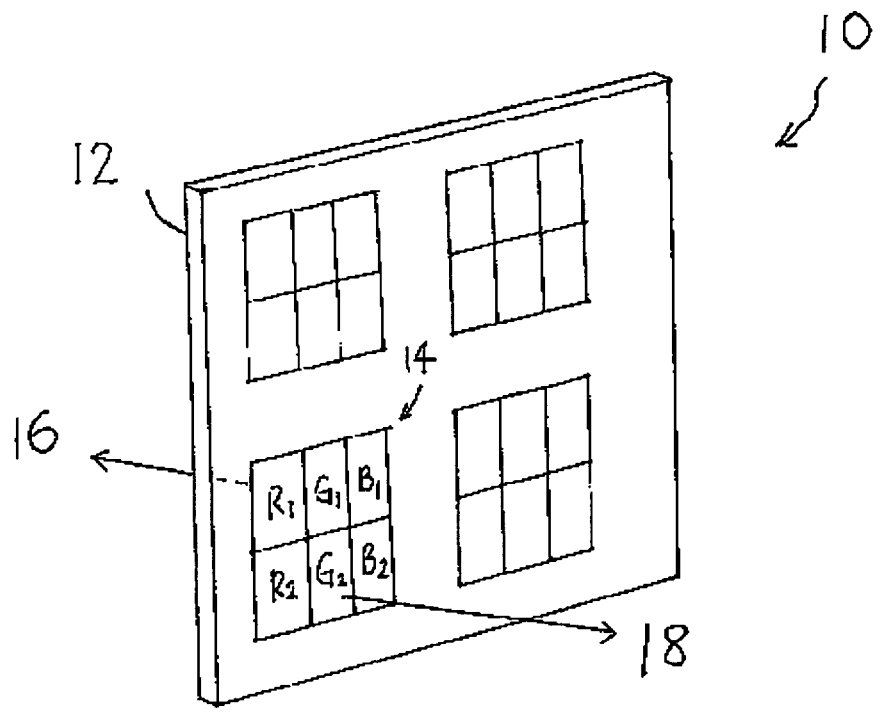
FIG. 1 shows a dual-display panel of an organic electroluminescence ("EL") device consistent with an embodiment of the present invention.

FIG. 1 is a schematic diagram of a dual-display panel 12 of an organic electroluminescence ("EL") device 10 consistent with an embodiment of the present invention. Dual-display panel 12 is provided with an array of pixels (not numbered). An exemplary pixel 14 includes a first set of sub-pixels $R_1$, $G_1$ and $B_1$ for display of colors red, green and blue, respectively, and a second set of sub-pixels $R_2$, $G_2$ and $B_2$ for display of colors red, green and blue, respectively. The first set of sub-pixels $R_1$, $G_1$ and $B_1$ functions to provide image display in a first direction indicated by an arrow 16, and the second set of sub-pixels $R_2$, $G_2$ and $B_2$ functions to provide image display in a second direction indicated by an arrow 18. In an aspect consistent with the invention, the first direction is substantially opposite to the second direction. In operation, the first sets of sub-pixels of all pixels may be coupled to receive a first set of signals for collectively displaying a first image in the first direction, and the second sets of sub-pixels of all pixels may be coupled to receive a second set of signals for collectively displaying a second image in the second direction. The first set of signals and the second signals may be provided at the same time for displaying the first image and the second image simultaneously or at different times for displaying the first image and the second image off from each other.

Figure 2A:
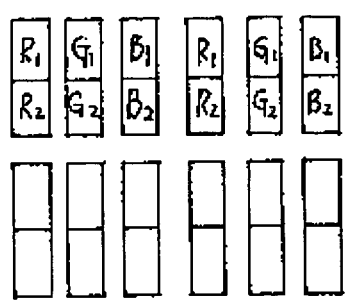
FIG. 2A shows a pixel arrangement of an organic EL device consistent with an embodiment of the present invention.

FIG. 2A is a diagram of an exemplary pixel arrangement of an organic EL device consistent with an embodiment of the present invention. Sub-pixels $R_1$ and $R_2$ are formed in a sub-pixel area that may otherwise be provided for a single sub-pixel for the color red display. Similarly, sub-pixels $G_1$ and $G_2$, and sub-pixels $B_1$ and $B_2$ are formed in a single sub-pixel area that may otherwise be provided for a single sub-pixel for display of the colors green and blue, respectively. Sub-pixels $R_1$, $G_1$ and $B_1$ of a first set of sub-pixels in pixel 14 are substantially aligned with one another. Likewise, sub-pixels $R_2$, $G_2$ and $B_2$ of a second set of sub-pixels in pixel 14 are substantially aligned with one another. The first set of sub-pixels $R_1$, $G_1$ and $B_1$ is substantially aligned with the second set of sub-pixels $R_2$, $G_2$ and $B_2$ in pixel 14.

Figure 2B:
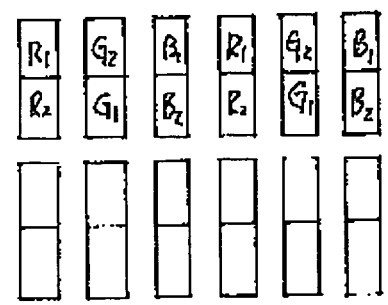
FIG. 2B shows a pixel arrangement of an organic EL device consistent with another embodiment of the present invention.

FIG. 2B is a diagram of another exemplary pixel arrangement of an organic EL device consistent with another embodiment of the present invention. Sub-pixels $R_1$, $G_1$ and $B_1$ of a first set of sub-pixels in pixel 14 are formed in a delta arrangement. Likewise, sub-pixels $R_2$, $G_2$ and $B_2$ of a second set of sub-pixels in pixel 14 are formed in another delta arrangement. The first set of sub-pixels $R_1$, $G_1$ and $B_1$ are interleaved with the second set of sub-pixels $R_2$, $G_2$ and $B_2$ in pixel 14.

Although only two different arrangements of the sub-pixels are shown in FIGS. 2A and 2B, it is to be understood that arrangement of the sub-pixels is not limited thereto and may be in any other form than shown in FIGS. 2A and 2B. For example, the first set of sub-pixels may be offset from the second set of sub-pixels. Further, consistent with the present invention, there may be provided two sets of pixels arranged in any suitable form on a single substrate for displaying images in opposite directions.

Figure 3A:
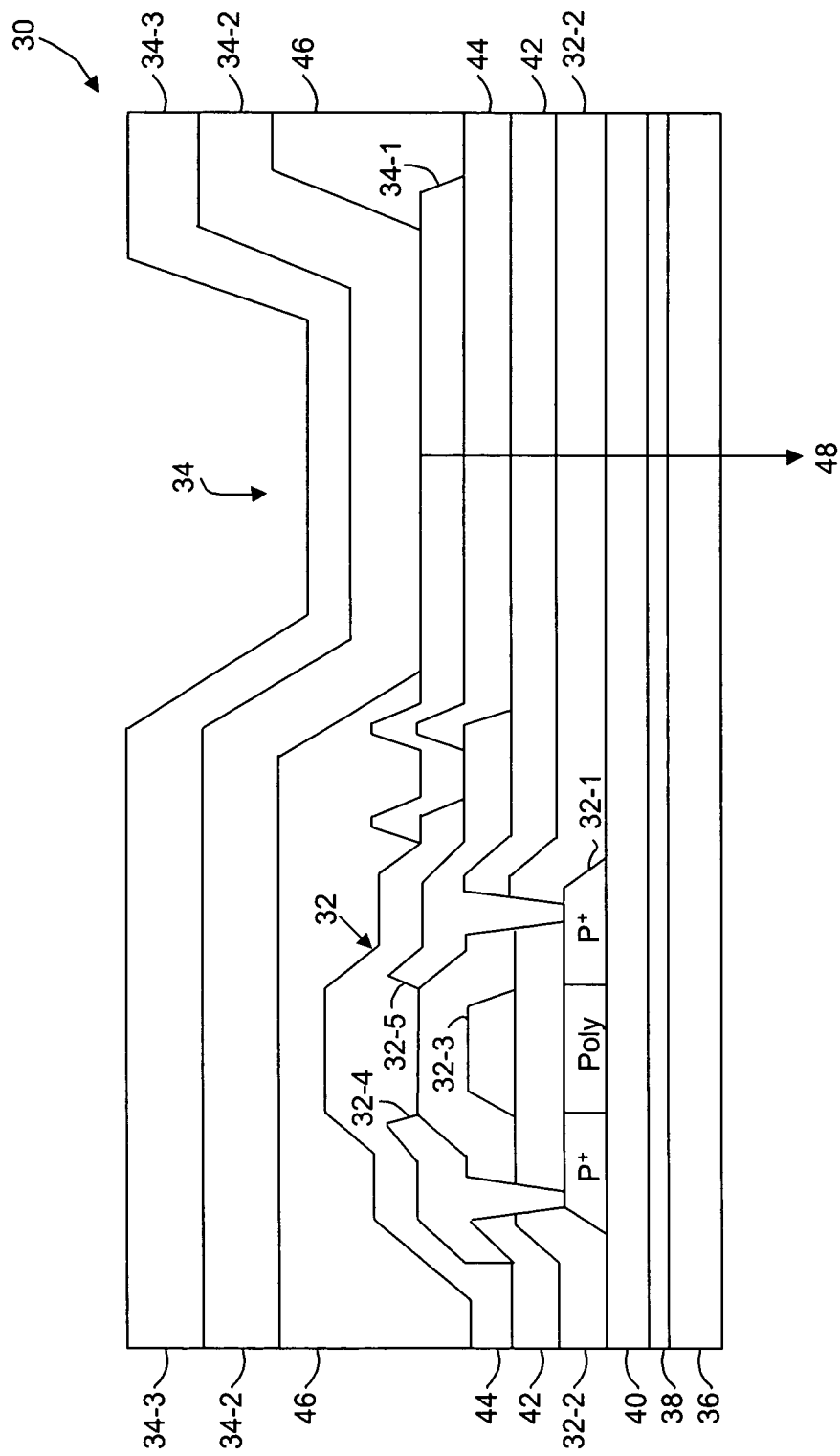
FIG. 3A is a cross-sectional view of a pixel of an organic EL device consistent with yet another embodiment of the present invention.

FIG. 3A is a cross-sectional view of a sub-pixel 30 of an organic EL device consistent with an embodiment of the present invention. Sub-pixel 30, which corresponds to one of the first and second sub-pixels as described above, includes a thin film transistor ("TFT") 32 and an organic light emitting diode ("OLED") 34. TFT 32 is used to drive OLED 34. The organic EL device including TFTs 32 and OLEDs 34 is also referred to as an active matrix organic light emitting diode ("AMOLED") device. TFT 32 and OLED 34 are formed on a transparent substrate 36 over which a layer of silicon nitride 38 and a layer of silicon oxide 40 are formed. TFT 32 includes a semiconductor layer 32-1, a gate oxide layer 32-2, a gate electrode 32-3, a source electrode 32-4 and a drain electrode 32-5. Semiconductor layer 32-1 may further include contact regions heavily doped with, for example, p-type impurities for ohmic contact, and an active region made of polycrystalline silicon. An inter-layer dielectric ("ILD") 42 is provided to electrically isolate gate electrode 32-3 and source and drain electrodes 32-4 and 32-5. A first passivation layer 44 made of insulating material such as silicon nitride or silicon oxide is formed over substrate 36, exposing a portion of drain electrode 32-5 to serve as a contact hole.

OLED 34 includes a conductive layer 34-1, an organic electroluminescence ("EL") layer 34-2 and a reflecting layer 34-3. Material of the conductive layer 34-1 such as indium tin oxide ("ITO") to serve as anode is formed to cover first passivation layer 44 excluding a portion corresponding to TFT 32. A second passivation layer 46 is formed over substrate 36 to cover TFT 32. Organic EL layer 34-2, which may contain layers of organic materials, is formed over second passivation layer 46 and the conductive layer 34-1. Material of the reflecting layer 34-3 such as aluminum (Al) to serve as cathode is formed over organic EL layer 34-2. When OLED 34 is driven by TFT 32, light radiating from organic EL layer 34-2 in part penetrates through the conductive layer 34-1 and in part is reflected by the reflecting layer 34-3, resulting in light emission through transparent substrate 36 in a first direction indicated by an arrow 48. In one aspect, sub-pixel 30 corresponds to one of the first set of sub-pixels $R_1$, $G_1$ and $B_1$ shown in FIG. 2A or 2B.

Figure 3B:
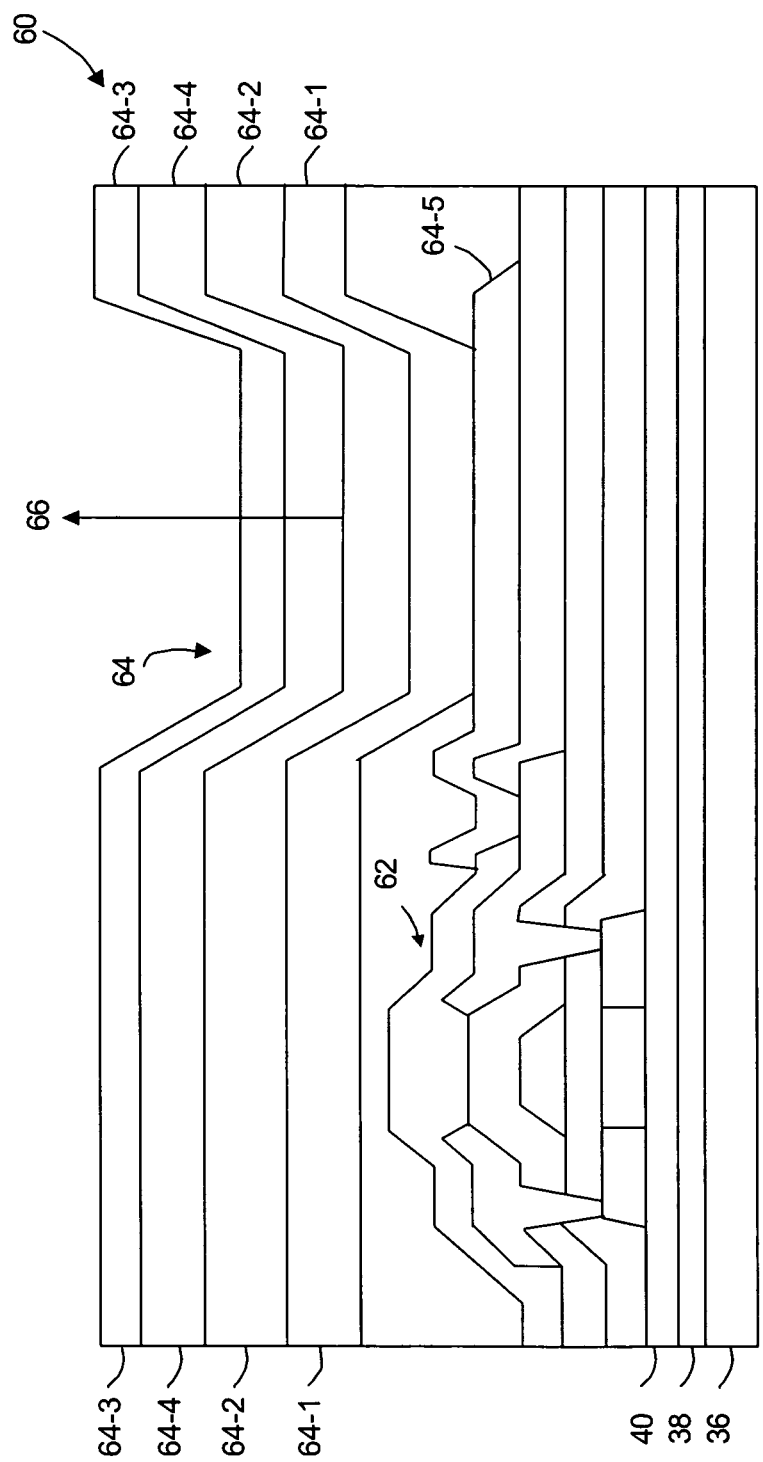
FIG. 3B is a cross-sectional view of a pixel of an organic EL device consistent with still another embodiment of the present invention.

FIG. 3B is a cross-sectional view of a sub-pixel 60 of an organic EL device consistent with another embodiment of the present invention. Sub-pixel 60, which corresponds to another one of the first and second sub-pixels as described above, includes a thin film transistor ("TFT") 62 and an organic light emitting diode ("OLED") 64. TFT 62, used to drive OLED 64, has a similar structure to TFT 32 and is not further described. TFT 62 and OLED 64 are formed on transparent substrate 36 over which a layer of silicon nitride 38 and a layer of silicon oxide 40 are formed. OLED 64 includes a conductive layer 64-1 to serve as an anode, an organic electroluminescence ("EL") layer 64-2 and a transparent conductive layer 64-3 to serve as a cathode. Material of the conductive layer 64-1 such as indium tin oxide (ITO) to serve as anode is formed over substrate 36. Organic EL layer 64-2 is formed over the conductive layer 64-1. Material of the transparent conductive layer 64-3 such as indium zinc oxide ("IZO") to serve as a cathode is formed over organic EL layer 64-2. The transparent conductive layer 64-3 has a thickness ranging from approximately 50 to 10,000 angstroms (Å). In one aspect, a thin conductive layer 64-4 is formed over organic EL layer 64-2 before the transparent conductive layer 64-3 is formed. The thin conductive layer 64-4 includes, for example, aluminum, and is thin enough to remain transparent to light. In another aspect, the thin conductive layer 64-4 has a thickness of less than 500 angstroms (Å), and the thickness may, for example, be 50 to 100 angstroms. A reflecting layer 64-5 is formed underneath the conductive layer 64-1 for reflecting light emitted from organic EL layer 64-2. Thus, when OLED 64 is driven by TFT 62, light radiating from organic EL layer 64-2 in part penetrates through the transparent conductive layer 64-3 and in part is reflected by the reflecting layer 64-5, resulting in light emission through the transparent conductive layer 64-3 in a second direction indicated by an arrow 66. In one aspect, sub-pixel 60 corresponds to one of the second set of sub-pixels $R_2$, $G_2$ and $B_2$ shown in FIG. 2A or 2B. In another aspect, the second direction is substantially opposite to the first direction shown in FIG. 3A.

FIGS. 4A to 4F are diagrams showing a method of manufacturing an organic EL device consistent with an embodiment of the present invention. Transparent substrate 36, such as a glass substrate, is formed by, for example, cleaning and impurity doping. A layer of silicon nitride 38 and a layer of silicon oxide 40 are formed on transparent substrate 36.

Figure 4B:
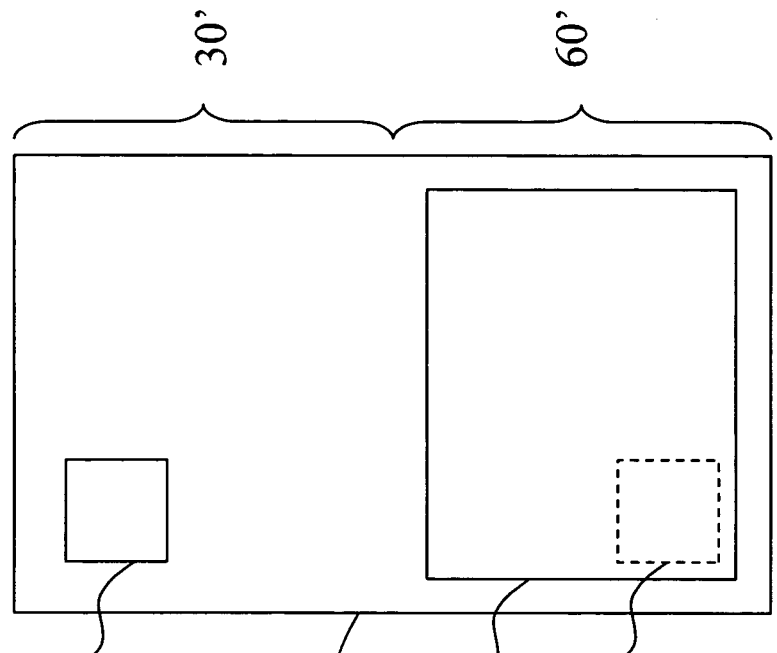
Figure 4A:
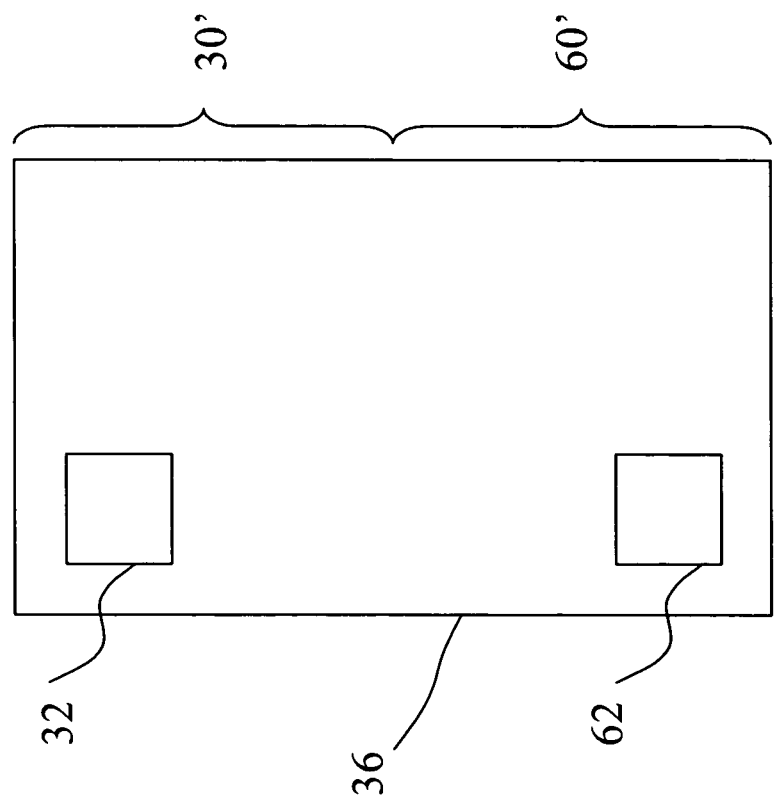

Referring now to FIG. 4A, a plurality of sub-pixel areas are defined on transparent substrate 36. Each of the sub-pixel areas includes a first sub-pixel area 30' wherein sub-pixel 30 as shown in FIG. 3A is to be formed and a second sub-pixel area 60' wherein sub-pixel 60 as shown in FIG. 3B is to be formed. Thin film transistors ("TFT") 32 and 62 are formed in the first and second sub-pixel areas 30' and 60', respectively.

Referring to FIG. 4B, a reflecting layer 64-5 is formed in the second sub-pixel area 60'. Reflecting layer 64-5 may comprise metal.

Referring to FIG. 4C, a conductive layer 34-1 of sub-pixel 30 is formed in the first sub-pixel area 30' and a conductive layer 64-1 of sub-pixel 60 is formed in the second sub-pixel area 60'. In one aspect, the conductive layer 34-1 and 64-1 may comprise ITO. The conductive layer 34-1 serves as an anode electrode of OLED 34. The conductive layer 64-1 and the reflecting layer 64-5 may together serve as an anode electrode of OLED 64.

Referring to FIG. 4D, the organic EL layers 34-2 and 64-2 are formed in the first sub-pixel area 30' and the second sub-pixel area 60', respectively. In one aspect, the organic EL layers 34-2 and 64-2 are pigmented with the same color. In another aspect, the organic EL layers 34-2 and 64-2 are formed by depositing a layer of organic EL materials in both the first and second sub-pixel areas 30' and 60'.

Referring to FIG. 4E, the reflecting layer 34-3 is formed over the organic EL layer 34-2 in the first sub-pixel area 30'. The reflecting layer 34-3, such as an aluminum layer, serves as a cathode electrode of OLED 34.

Referring to FIG. 4F, a transparent conductive layer 64-3 is provided over organic EL layer 64-2 to form a cathode of OLED 64 in the second sub-pixel area 60'. In an aspect consistent with the present invention, the transparent conductive layer 64-3 is also formed over the reflecting layer 34-3 of sub-pixel 30 in the first sub-pixel area 30'. In another aspect, the transparent conductive layer 64-3 may comprise IZO. In still another aspect, a thin conductive layer 644 may also be formed over organic EL layer 64-2 of FIG. 3B before the transparent conductive layer 64-3 is formed. The thin conductive layer 64-4 may comprise aluminum. In one aspect, the thin conductive layer 644 has a thickness of less than 500 angstroms. In another aspect, the thin conductive layer 644 is also formed over the reflecting layer 34-3 of sub-pixel 30 in the first sub-pixel area 30'.

During the manufacturing process as discussed above, a plurality of pixels may be simultaneously formed over substrate 36 to form a pixel array. Each pixel may include a first set of sub-pixels each having the same structure as sub-pixel 30 and a second set of sub-pixels each having the same structure as sub-pixel 60, wherein the first set of sub-pixels provides light in a first direction pointing towards substrate 36 as indicated by arrow 48 in FIG. 3A and the second set of sub-pixels provides light in a second direction pointing away from substrate 36 as indicated by arrow 66 in FIG. 3B.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing an organic electroluminescence (EL) device, comprising: providing a transparent substrate; defining a first area and a second area on the transparent substrate; forming a transistor in each of the first and second areas; forming a first reflecting layer over the substrate in the second area; forming a first transparent conductive layer over the substrate in the first area and over the first reflecting layer in the second area; forming an organic EL layer over the first transparent conductive layer in both the first area and the second area; forming a second reflecting layer over the organic EL layer in the first area; and forming a second transparent conductive layer over the organic EL layer in at least one of the first area and the second area.

2. The method of claim 1, further comprises forming a thin conductive layer over the second reflecting layer and over the organic EL layer in the second area.

3. The method of claim 2, wherein forming the thin conductive layer over the second reflecting layer and over the organic EL layer in the second area is before forming the second transparent conductive layer over the organic EL layer in at least the second area.

4. The method of claim 1, wherein forming the second transparent conductive layer over the organic EL layer in at least one of the first area and the second area comprises forming the second transparent conductive layer over the organic EL layer in the second area and over the second reflecting layer in the first area simultaneously.

5. The method of claim 1, further comprising pigmenting the organic EL layer in a same color in the first and second areas.

* * * * *